US012376267B2

(12) United States Patent
Wang et al.

(10) Patent No.: US 12,376,267 B2
(45) Date of Patent: Jul. 29, 2025

(54) IMMERSION LIQUID COOLING DEVICE AND LIQUID COOLING SYSTEM

(71) Applicant: Beijing Youzhuju Network Technology Co., Ltd., Beijing (CN)

(72) Inventors: Ruidong Wang, Beijing (CN); Yuanlin Ren, Beijing (CN); Zhichao Lv, Beijing (CN); Chen Shen, Beijing (CN); Shifeng Wang, Beijing (CN); Yulong Wang, Beijing (CN); Chenglong Gui, Beijing (CN); Xianghui Zeng, Beijing (CN); Linan Gao, Beijing (CN); Zhibo Zhao, Beijing (CN); Jian Wang, Beijing (CN)

(73) Assignee: BEIJING YOUZHUJU NETWORK TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 18/983,053

(22) Filed: Dec. 16, 2024

(65) Prior Publication Data
US 2025/0120051 A1 Apr. 10, 2025

Related U.S. Application Data

(63) Continuation of application No. PCT/CN2023/098719, filed on Jun. 6, 2023.

(30) Foreign Application Priority Data

Jun. 17, 2022 (CN) .......................... 202210692514.2

(51) Int. Cl.
H05K 7/20 (2006.01)
(52) U.S. Cl.
CPC ..... H05K 7/20781 (2013.01); H05K 7/20236 (2013.01); H05K 7/20263 (2013.01); H05K 7/20272 (2013.01)

(58) Field of Classification Search
CPC .......... H05K 7/20327; H05K 7/20781; H05K 7/20272; H05K 7/20263
See application file for complete search history.

(56) References Cited

U.S. PATENT DOCUMENTS 10,750,637 B1 * 8/2020 Alissa ................ H05K 7/20781
2018/0070477 A1 3/2018 Saito
(Continued)

FOREIGN PATENT DOCUMENTS

CA 3155776 A1 * 5/2021 ............. B66C 17/12
CN 109195424 A 1/2019
(Continued)

OTHER PUBLICATIONS

International Search Report for PCT/CN2023/098719, mailed on Jul. 20, 2023, 6 pages.
(Continued)

Primary Examiner — Tho V Duong
(74) Attorney, Agent, or Firm — Astute IP Law Group

(57) ABSTRACT

The embodiments of the disclosure provide an immersion liquid cooling device and a liquid cooling system. The liquid cooling device includes a cabinet comprising a first cavity and a second cavity integrated on a side wall of the first cavity; and a heat exchange module adapted to be inserted into the second cavity via an opening on the second cavity, and comprising a heat exchanger, a coolant driving device and a guiding assembly, the heat exchanger being configured to cool the first coolant with the second coolant, the coolant driving device being configured to drive the first coolant to circulate between the second cavity and the first cavity, and the guiding assembly comprising a liquid flow channel configured to guide the first coolant from the coolant driving device to the heat exchanger.

20 Claims, 7 Drawing Sheets

(56) References Cited

U.S. PATENT DOCUMENTS

| 2020/0337176 A1* | 10/2020 | Aoki | ................. | H05K 7/20327 |
| 2023/0189476 A1* | 6/2023 | Wu | .................... | H05K 7/20263 |
| | | | | 361/699 |
| 2024/0224476 A1* | 7/2024 | Kajitani | .................... | G06F 1/20 |

FOREIGN PATENT DOCUMENTS

| CN | 113301766 | A | 8/2021 |
| CN | 114035666 | A | 2/2022 |
| CN | 114096133 | A | 2/2022 |
| CN | 114206086 | A | 3/2022 |
| CN | 216532329 | U | 5/2022 |
| CN | 216532420 | U | 5/2022 |
| CN | 115038303 | A | 9/2022 |
| CN | 217608200 | U | 10/2022 |
| CN | 115038303 | B | 3/2025 |
| JP | 2009537905 | A | 10/2009 |
| JP | 2020197336 | A | 12/2020 |
| WO | 2021080660 | A1 | 4/2021 |

OTHER PUBLICATIONS

Office Action for Chinese Patent Application No. 202210692514.2, mailed on Jul. 9, 2024, 17 pages.
Request for the Submission of an Opinion for Korean Patent Application No. 10-2024-7041794, mailed May 7, 2025, 19 pages.
Notice of Reasons for Refusal for Japanese Patent Application No. 2024-573577, mailed on May 27, 2025, 14 pages.

* cited by examiner

IMMERSION LIQUID COOLING DEVICE AND LIQUID COOLING SYSTEM

CROSS-REFERENCE

The present application is a continuation of International Patent Application No. PCT/CN2023/098719, filed on Jun. 6, 2023, which claims priority to Chinese Patent Application No. 202210692514.2, filed on Jun. 17, 2022 and entitled "IMMERSION LIQUID COOLING DEVICE AND LIQUID COOLING SYSTEM", the contents of which are incorporated herein by reference in their entireties.

FIELD

Embodiments of the present disclosure generally relate to the technical field of electronic device cooling, and more particularly, to an immersion liquid cooling device and a liquid cooling system including the immersion liquid cooling device.

BACKGROUND

With the integrative development of new generation information and communication technologies such as 5G, cloud computing, big data, artificial intelligence and the like and entity economy, a data center is gradually expanding from serving a part of enterprises to serving the whole society and becomes a new infrastructure.

Such a new infrastructure proposes higher requirements for the heat dissipation solution and overall energy efficiency of the data center. On the one hand, with the advent of the era of big data, data is growing at a speed beyond imagination, the processing, storage and transmission of massive data require that the power consumption of IT equipment grows exponentially, so that the heat dissipation of the chip becomes a huge challenge. Conventional air cooling heat dissipation solutions have been difficult to meet the requirements of efficient heat dissipation of electronic information equipment.

In order to solve the heat dissipation problem of high power consumption IT equipment, the data center starts to adopt a liquid cooling technology, a working fluid is used as a medium for intermediate heat transmission, and heat is transferred from a heating area to a cooling tower for cooling. The cooling efficiency of the liquid cooling technology is remarkably higher than that of the air cooling heat dissipation, the heat dissipation problem of the high power consumption IT equipment can be effectively solved, the energy consumption of the cooling system is reduced, and the noise is reduced.

In a current data center using a liquid cooling solution, a conventional immersion liquid cooling system is generally composed of a large cabinet (usually about 3 meters in length) and equipped with one or more sets of cold liquid distribution units (CDUs). However, such a conventional immersion liquid cooling system is large in size, complicated in structure and inconvenient to be assembled. In addition, the liquid cooling system has difficulty in operation and maintenance and poor reliability.

Therefore, there is a need for an improved data center liquid cooling scheme.

SUMMARY

An object of the present disclosure is to provide an immersion liquid cooling device and a liquid cooling system including the same, to at least partially solve the above problems.

In a first aspect of the present disclosure, there is provided an immersion liquid cooling device, comprising: a cabinet comprising a first cavity and a second cavity integrated on a side wall of the first cavity, the first cavity being configured to accommodate an electronic device to be cooled, and the side wall being provided with a through hole for a first coolant to circulate between the first cavity and the second cavity; and a heat exchange module adapted to be inserted into the second cavity via an opening on the second cavity, the heat exchange module comprising a heat exchanger, a coolant driving device and a guiding assembly, the heat exchanger being configured to receive a second coolant via a liquid circulating pipeline and cool the first coolant with the second coolant, the coolant driving device being configured to drive the first coolant to circulate between the second cavity and the first cavity, and the guiding assembly comprising a liquid flow channel configured to guide the first coolant from the coolant driving device to the heat exchanger, wherein when the heat exchange module is inserted into the second cavity, the coolant driving device is closer to the opening of the second cavity than the heat exchanger, and the coolant driving device is capable of being extracted from the second cavity when the heat exchanger and the guiding assembly are kept in the second cavity.

According to the embodiments of the disclosure, since the cabinet is integrated with the heat exchange module, the whole system does not need to additionally carry the cold liquid distribution unit, and is very flexible and convenient. In addition, since the heat exchange module adopts a modular design, it is convenient to assemble and maintain. In addition, compared with the heat exchanger, the operation and maintenance requirements of the coolant driving device in the heat exchange module are higher, so that the coolant driving device can be separately extracted from the cabinet by arranging the coolant driving device above the heat exchanger, which facilitates the maintenance of the coolant driving device and shortens the maintenance time of the coolant driving device.

In some embodiments, the heat exchange module further comprises a first bracket, and the heat exchanger and the guiding assembly are supported by the first bracket, and the coolant driving device comprises a first driving assembly, the first driving assembly comprises a second bracket and a first circulating pump supported by the second bracket, the second bracket is detachably connected to the first bracket, wherein when the second bracket is connected to the first bracket, a circulating pump outlet of the first circulating pump is communicated with a liquid flow channel in the guiding assembly. In such an embodiment, through the cooperation between the first bracket and the second bracket, the first driving assembly can be conveniently extracted from the cabinet or the first driving assembly can be extracted from the cabinet together with other components in the heat exchange module.

In some embodiments, the first bracket comprises a first support part and a second support part, the second bracket is detachably connected to the first support part, the heat exchanger and the guiding assembly are supported by the second support part, and when the heat exchange module is inserted into the second cavity, the first support part is located outside the second cavity. In such an embodiment, reliable support of the cabinet to the heat exchange module may be achieved by the first bracket, and the first bracket may prevent leakage of the first coolant in the second cavity.

In some embodiments, a side of the first support part facing the second cavity is provided with a sealing ring, and when the heat exchange module is inserted into the second cavity, the first support part and the second cavity are sealed through the sealing ring. In such an embodiment, the sealing ring can improve the sealing performance between the first support part and the second cavity, and further reduce the leakage of the first coolant in the second cavity.

In some embodiments, a side of the first support part facing away from the second cavity is provided with a display screen for displaying an operating state of the coolant driving device. In such an embodiment, the operating state of the coolant driving device can be observed in real time through the display screen, so that the coolant driving device may be maintained when the coolant driving device operates abnormally.

In some embodiments, the heat exchanger and the guiding assembly are fixed to the second support part through fasteners. In such embodiments, the heat exchanger and the guiding assembly may be fixed to the second support part with the fasteners.

In some embodiments, the second bracket comprises a third support part and a fourth support part, the third support part is detachably connected to the first support part, and the first circulating pump is supported by the fourth support part. In such an embodiment, the assembly and disassembly between the first driving assembly and the first bracket can be conveniently achieved through the cooperation between the third support part and the first support part.

In some embodiments, a side of the third support part facing away from the first circulating pump is provided with a handle. In such an embodiment, the first driving assembly can be separately extracted from the second cavity or the heat exchange module is integrally extracted conveniently by using the handle.

In some embodiments, the fourth support part comprises a first inclined portion inclined relative to an extraction direction of the first driving assembly, and the circulating pump outlet of the first circulating pump is disposed at the first inclined portion, and the guiding assembly comprises a second inclined portion inclined relative to the extraction direction, wherein the second inclined portion is attached to the first inclined portion when the third support part is connected to the first support part. In such an embodiment, the cooperation of the first inclined portion and the second inclined portion can ensure accurate positioning of the first driving assembly during insertion, and on the other hand, ensure reliable communication between the circulating pump outlet of the first circulating pump and the liquid flow channel in the guiding assembly.

In some embodiments, the first driving assembly further comprises a filter provided at a circulating pump inlet of the first circulating pump. In such an embodiment, the first coolant entering the first circulating pump may be filtered to prevent impurities from entering the pump body to cause damage to the first circulating pump.

In some embodiments, the coolant driving device further comprises a second driving assembly, the second driving assembly comprises a third bracket and a second circulating pump supported by the third bracket, and the third bracket is detachably connected to the first bracket. In such an embodiment, by providing the redundant second driving assembly, when one of the first driving assembly and the second driving assembly has a problem, the other driving assembly can still operate normally, thereby improving the reliability of the liquid cooling device.

In some embodiments, the guiding assembly comprises a first guide, a second guide and a third guide, the second guide and the third guide are disposed above the first guide, a liquid flow channel in the second guide is communicated with the circulating pump outlet of the first circulating pump, a liquid flow channel in the third guide is communicated with a circulating pump outlet of the second circulating pump, and a liquid flow channel in the first guide is connected to the heat exchanger. In such an embodiment, on one hand, the first guide, the second guide and the third guide can reliably guide the first coolant from the coolant driving device to the heat exchanger, and on the other hand, the volume of the first coolant in the second cavity can be discharged, so that the liquid level of the first coolant in the second cavity rises, the amount of the first coolant required in the cabinet is reduced, and the overall cost is reduced.

In some embodiments, the heat exchanger is a plate heat exchanger comprising an outer cavity and an inner cavity surrounded by the outer cavity, the outer cavity comprises a first liquid inlet and a first liquid outlet, the first liquid inlet is connected to a liquid flow channel in the guiding assembly to receive the first coolant, the first liquid outlet is configured to release the first coolant from the outer cavity into the second cavity, and the inner cavity comprises a second liquid inlet and a second liquid outlet, the second liquid inlet is connected to a liquid inlet pipe in the liquid circulating pipeline to receive the second coolant, and the second liquid outlet is connected to a liquid return pipe in the liquid circulating pipeline. In such an embodiment, the first coolant in the outer cavity and the second coolant in the inner cavity can form heat exchange in the form of cross-flow, which enhances the heat exchange efficiency of the heat exchanger.

In some embodiments, the through hole comprises a first group of through holes and a second group of through holes, the second group of through holes are closer to the opening of the second cavity than the first group of through holes, and when the heat exchange module is inserted into the second cavity, the coolant driving device is adjacent to the second group of through holes, and the heat exchanger is adjacent to the first group of through holes. In such an embodiment, the rapid circulation of the first coolant between the second cavity and the first cavity can be achieved by arranging the coolant driving device adjacent to the second group of through holes. In addition, by arranging the heat exchanger adjacent to the first group of through holes, the first coolant cooled by the heat exchanger can flow into the first cavity in time through the first group of through holes.

In some embodiments, the heat exchange module further comprises a liquid-occupying block, wherein when the heat exchange module is inserted into the second cavity, the liquid-occupying block is capable of being at least partially immersed in the first coolant in the second cavity. In such an embodiment, when the heat exchange module is inserted into the second cavity, the liquid-occupying block can discharge the volume of the first coolant, thereby reducing the amount of the first coolant required in the cabinet and reducing the overall cost.

In some embodiments, the cabinet further comprises an outer frame and a top cover, the outer frame is disposed around the first cavity and the second cavity, the top cover is rotatably connected to the outer frame and capable of switching between a closed state in which the first cavity is closed and an open state in which the first cavity is opened. In such an embodiment, by using the top cover to close the first cavity, leakage of the first coolant in the first cavity can be reduced, and external contaminants can be prevented from entering the first cavity.

In some embodiments, a side of the top cover facing the first cavity is provided with a sealing ring, and when the top cover is in the closed state, the top cover and the first cavity are sealed through the sealing ring. In such an embodiment, the sealing ring can improve the sealing performance between the top cover and the first cavity, and further reduce the leakage of the first coolant in the first cavity.

In some embodiments, the cabinet further comprises a hydraulic driving device connected between the outer frame and the top cover to drive the top cover to switch between the closed state and the open state. In such embodiments, the top cover can be conveniently opened or closed with the hydraulic driving device.

In some embodiments, the first coolant comprises a fluorinated liquid or a mineral oil, and/or the second coolant comprises deionized water.

In a second aspect of the present disclosure, there is provided a liquid cooling system, comprising a plurality of immersion liquid cooling devices arranged side by side, wherein each immersion liquid cooling device of the plurality of immersion liquid cooling devices is the immersion liquid cooling device according to the first aspect of the present disclosure.

It should be understood that the content described in the summary is not intended to limit key features or important features of the embodiments of the present disclosure, nor is it intended to limit the scope of the present disclosure. Other features of the present disclosure will become readily understood from the following description.

BRIEF DESCRIPTION OF DRAWINGS

The above and other features, advantages, and aspects of various embodiments of the present disclosure will become more apparent from the following detailed description taken in conjunction with the accompanying drawings. In the drawings, the same or similar reference numbers refer to the same or similar elements, wherein.

DETAILED DESCRIPTION

Figure 1:
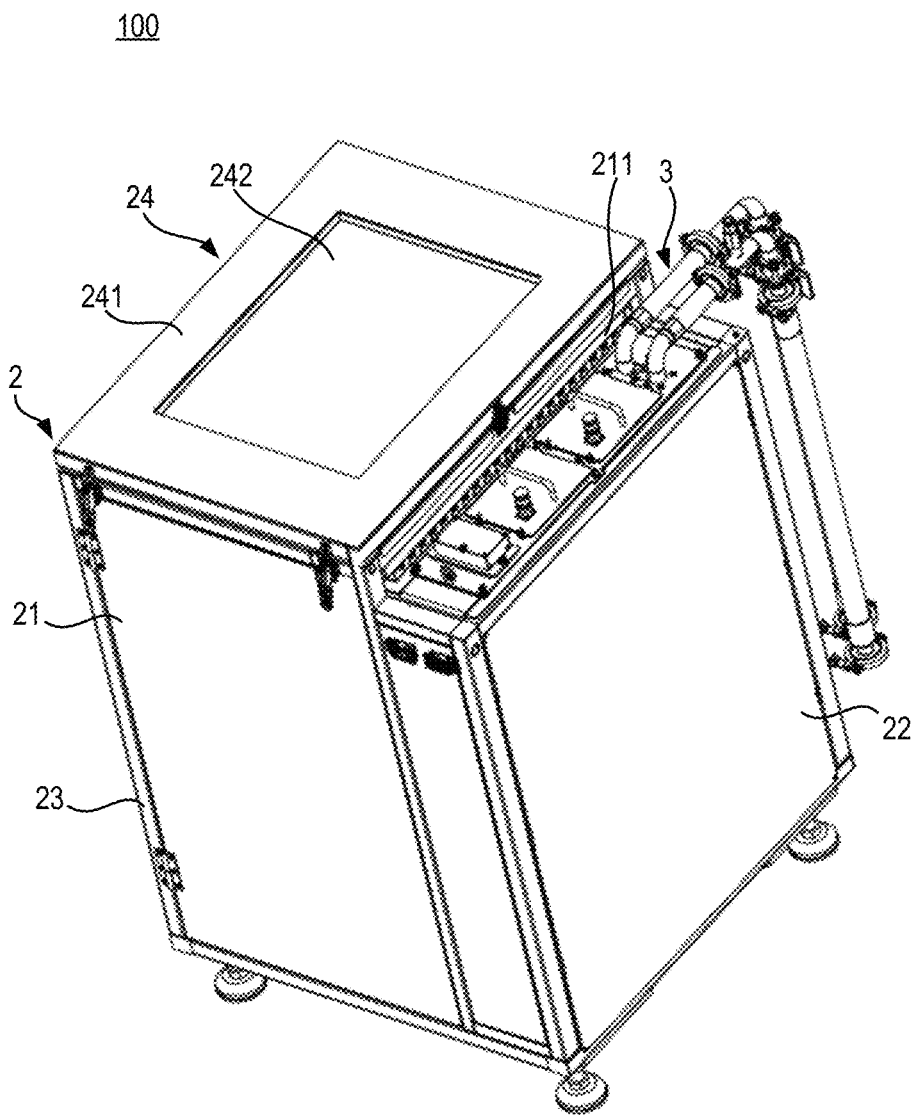
FIGS. 1 and 2 show schematic structural diagrams of an immersion liquid cooling device according to an embodiment of the present disclosure, wherein in FIG. 1, the heat exchange module is in a state inserted into the second cavity, and in FIG. 2, the heat exchange module is in a state extracted from the second cavity.

Preferred embodiments of the present disclosure will be described in more detail below with reference to the accompanying drawings. While the preferred embodiments of the present disclosure are shown in the drawings, it should be understood that the present disclosure may be implemented in various forms and should not be limited by the embodiments set forth herein. Rather, these embodiments are provided to make this disclosure more thorough and complete, and to fully convey the scope of the present disclosure to those skilled in the art.

As used herein, the term "comprising" and deformation thereof represent openness, i.e., "including but not limited to". Unless specifically stated, the term "or" means "and/or". The term "based on" means "based at least in part on". The terms "an example embodiment" and "an embodiment" mean "at least one example embodiment". The term "another embodiment" means "at least one further embodiment". The terms "first," "second," and the like may refer to different or identical object.

As described above, a conventional immersion liquid cooling system has various problems, such as large volume, complex structure, inconvenient assembly, difficult operation and maintenance, poor reliability, and the like. Embodiments of the present disclosure provide an immersion liquid cooling device integrating a heat exchanger inside and a liquid cooling system including the immersion liquid cooling device, so as to reduce operation and maintenance difficulty, reduce architectural complexity, enhance adaptability, and improve reliability. Hereinafter, the principles of the present disclosure will be described with reference to FIGS. 1 to 9.

Figure 2:
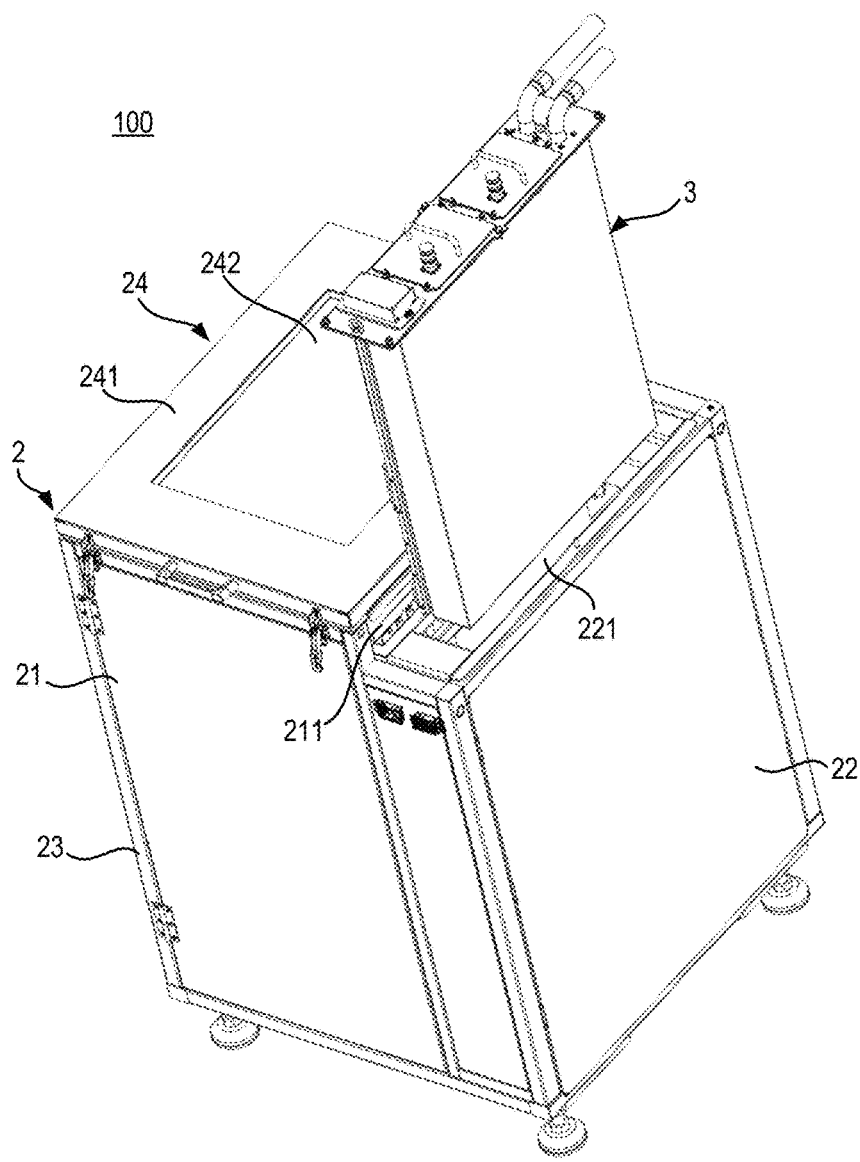

FIGS. 1 and 2 show schematic structural diagrams of an immersion liquid cooling device 100 according to an embodiment of the present disclosure, wherein in FIG. 1, the heat exchange module 3 is in a state inserted into the second cavity 22, and in FIG. 2, the heat exchange module 3 is in a state extracted from the second cavity 22. As shown in FIGS. 1 and 2, the immersion liquid cooling device 100 described herein generally includes a cabinet 2 and a heat exchange module 3. The cabinet 2 includes an outer frame 23, a first cavity 21, a second cavity 22 integrated on a side wall 211 of the first cavity 21, and a top cover 24. The first cavity 21 is configured to accommodate an electronic device to be cooled and a first coolant (not shown). The second cavity 22 is configured to accommodate the heat exchange module 3 and the first coolant. The first cavity 21 and the second cavity 22 are in fluid communication via a through hole 6 (see FIG. 3) disposed on the side wall 211, and the first coolant can circulate between the first cavity 21 and the second cavity 22 via the through hole 6. The heat exchange module 3 is adapted to be inserted into the second cavity 22 via an opening 221 in the second cavity 22.

In some embodiments, the electronic device contained in the first cavity 21 includes a server or a switch. In other embodiments, the electronic device may be of other types, and the embodiments of the present disclosure are not intended to be limited in this aspect.

As shown in FIGS. 1 and 2, the outer frame 23 generally surrounds the first cavity 21 and the second cavity 22 to provide mechanical support to the first cavity 21 and the second cavity 22 to some extent. The first cavity 21 and the second cavity 22 may be welded or otherwise mounted on the outer frame 23. In some embodiments, the outer frame 23 may be formed by welding profile square steel. In other embodiments, the outer frame 23 may be manufactured by other processes or other materials, and the embodiments of the present disclosure are not intended to be limited in this aspect.

In some embodiments, the first cavity 21 and the second cavity 22 may be formed by welding stainless steel plates.

In other embodiments, the first cavity 21 and the second cavity 22 may be manufactured by other processes or by using other materials, and the embodiments of the present disclosure are not intended to be limited in this aspect.

In some embodiments, the top cover 24 is rotatably connected to the outer frame 23 and is capable of switching between a closed state in which the first cavity 21 is closed and an open state in which the first cavity 21 is opened. The top cover 24 is shown in the closed state in FIGS. 1 and 2. The top cover 24 can reduce the leakage of the first coolant in the first cavity 21 in the closed state, and prevent the external contaminants from entering the first cavity 21. When the top cover 24 is in the open state, the operator may install or maintain the electronic device in the first cavity 21, and inject the first coolant into the first cavity 21.

In some embodiments, the first coolant includes a fluorinated liquid or a mineral oil. In other embodiments, the first coolant may also be of another type, and the embodiments of the present disclosure are not intended to be limited in this aspect.

In some embodiments, the top cover 24 may be opened more than 90 degrees relative to the outer frame 23. At the maximum opening angle, a stopper (not shown) may be provided to limit the position of the top cover 24.

In some embodiments, the top cover 24 may be connected to one side of the outer frame 23 by a hinge. In other embodiments, the top cover 24 may be connected to the outer frame 23 in other manners, for example, through a shaft-hole mating, and the embodiments of the present disclosure are not intended to be limited in this aspect.

In some embodiments, as shown in FIGS. 1 and 2, the top cover 24 includes a frame 241 and an observation window 242 surrounded by the frame 241. The frame 241 is connected to the outer frame 23 and is rotatable relative to the outer frame 23. The frame 241 may be made of an aluminum alloy or another type of metal or non-metal material. The observation window 242 may be made of a transparent polycarbonate (PC) material or other type of transparent material. By providing the observation window 242, even when the top cover 24 is in the closed state, the operator can observe the electronic device in the first cavity 21 through the observation window 242, and know the operating state of the electronic device in time.

In some embodiments, a side of the top cover 24 facing the first cavity 21 is provided with a sealing ring (not shown). When the top cover 24 is in the closed state, the top cover 24 and the first cavity 21 are sealed by the sealing ring. The sealing ring may include, for example, an ethylene propylene diene monomer (EPDM) rubber or other type of sealing material. By adopting the sealing ring, the sealing performance between the top cover 24 and the first cavity 21 can be improved, and the leakage of the first coolant in the first cavity 24 is further reduced.

In some embodiments, in order to achieve opening and closing of the top cover 24, the cabinet 2 further includes a hydraulic driving device (not shown). The hydraulic driving device is connected between the outer frame 23 and the top cover 24 for driving the top cover 24 to switch between the closed state and the open state. By means of the hydraulic driving device, the top cover 24 can be conveniently opened and closed.

In some embodiments, the hydraulic driving device includes a pair of hydraulic rods (not shown). One of the pair of hydraulic rods is connected between one side of the top cover 24 and a corresponding side of the outer frame 23. The other of the pair of hydraulic rods is connected between the other side of the top cover 24 and the corresponding side of the outer frame 23. The state switching of the top cover 24 can be achieved quickly and reliably by a pair of oppositely arranged hydraulic rods.

It should be understood that, in other embodiments, the top cover 24 may be switched between the closed state and the open state in other manners, and the embodiments of the present disclosure are not intended to be limited in this aspect.

In some embodiments, a handle (not shown) may also be disposed on a side of the top cover 24 facing away from the first cavity 21. With this arrangement, the operator may open and close the top cover 24 by grasping the handle.

Figure 3:
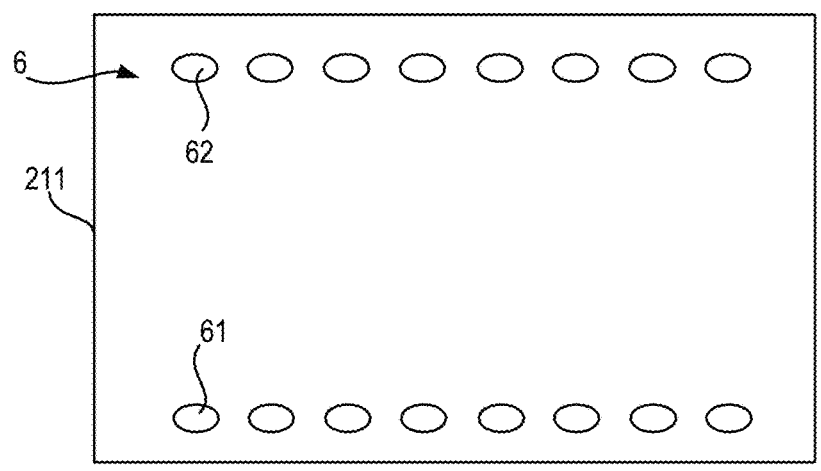
FIG. 3 illustrates a schematic structural diagram of a side wall of a first cavity for integrating a second cavity according to an embodiment of the present disclosure.

As described above, the first cavity 21 is in fluid communication with the second cavity 22 via the through hole 6 disposed on the side wall 211. FIG. 3 illustrates an example arrangement of the through holes 6 on the sidewalls 211 of the first cavity 21. In some embodiments, as shown in FIG. 3, the via 6 includes a first group of through holes 61 and a second group of through holes 62. The first coolant in the second cavity 22 may flow into the first cavity 21 via the first group of through holes 61, while the first coolant in the first cavity 21 may flow into the second cavity 22 via the second group of through holes 62.

In some embodiments, as shown in FIG. 3, each of the first group of through holes 61 may have an elliptical shape. It should be understood that, in other embodiments, each of the through holes in the first group of through holes 61 may be of other shapes, such as a circle, a rectangle, a square, a strip, etc., and the embodiments of the present disclosure are not intended to be limited in this aspect.

Similarly, as shown in FIG. 3, each of the second group of through holes 62 may have an elliptical shape. In other embodiments, each of the through holes in the second group of through holes 62 may be of other shapes, such as a circle, a rectangle, a square, a bar, etc., which is not intended to be limited in this aspect of the present disclosure.

In some embodiments, with reference to FIGS. 1 to 3, the first group of through holes 61 are disposed adjacent to the bottom side of the second cavity 22, and the second group of through holes 62 are disposed adjacent to the top side of the second cavity 22. With such an arrangement, most of the first coolant in the second cavity 22 can participate in the coolant circulation between the first cavity 21 and the second cavity 22.

It should be understood that, in the embodiments of the present disclosure, the through hole 6 on the side wall 211 may also be in other forms as long as a coolant circulating path between the first cavity 21 and the second cavity 22 can be provided. For example, the first group of through holes 61 may be replaced by a single or multiple elongated strip holes, and the second group of through holes 62 may also be replaced by a single or multiple elongated strip holes.

As mentioned above, both the first cavity 21 and the second cavity 22 are configured to accommodate the first coolant. In the first cavity 21, the first coolant may immerse the electronic device for cooling the electronic device. In the second cavity 22, the heat exchange module 3 may be at least partially immersed by the first coolant. The heat exchange module 3 may be connected to an external cooling device, such as a cooling tower, to receive a second coolant provided by an external cooling device. The temperature of the second coolant in the heat exchange module 3 is lower than the temperature of the first coolant in the second cavity 22, so that the first coolant in the second cavity 22 can be cooled.

In some embodiments, the second coolant in the heat exchange module 3 may include deionized water. In other embodiments, the second coolant may also be of other types, and the embodiments of the present disclosure are not intended to be limited in this aspect.

Figure 4:
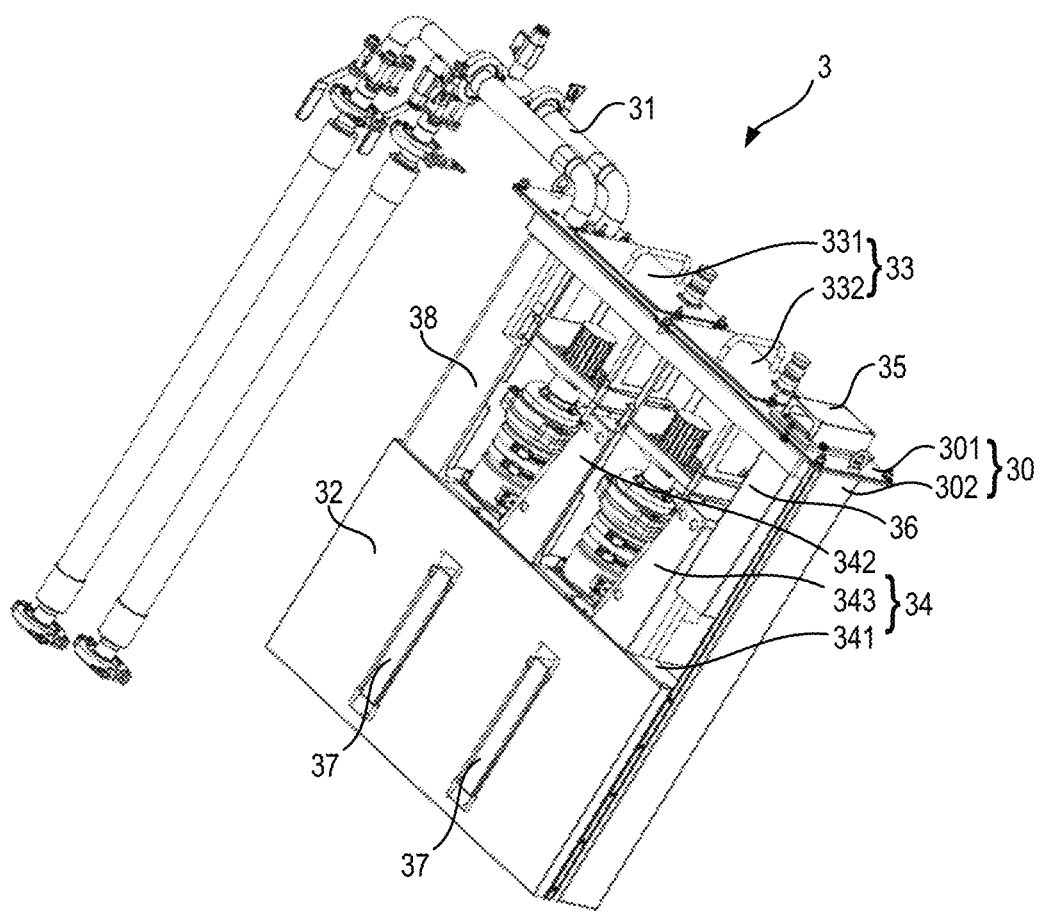
FIG. 4 is a schematic structural diagram of a heat exchange module according to an embodiment of the present disclosure.
Figure 5:
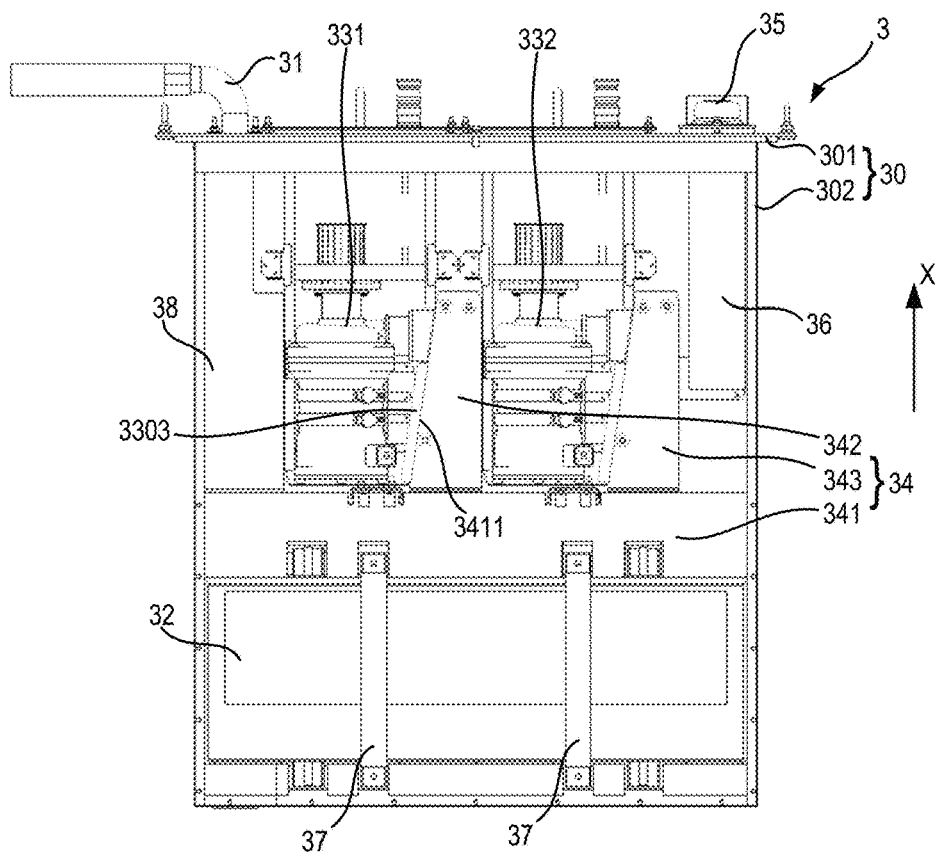
FIG. 5 shows a front view of the heat exchange module shown in FIG. 4.

An example structure of the heat exchange module 3 will be described below with reference to FIGS. 4 to 8. Referring to FIGS. 4 and 5, FIG. 4 is a schematic structural diagram of a heat exchange module 3 according to an embodiment of the present disclosure, and FIG. 5 shows a front view of the heat exchange module 3 shown in FIG. 4. In order to more clearly display the structure of the heat exchange module 3, a portion of the liquid circulating pipeline 31 is omitted in FIG. 5. As shown in FIGS. 4 and 5, the heat exchange module 3 includes a heat exchanger 32, a coolant driving device 33, and a guiding assembly 34. The heat exchanger 32 is in fluid communication with a liquid circulate line 31 for circulating a second coolant between the heat exchanger 32 and an external cooling device, such as a cooling tower. With this arrangement, the heat exchanger 32 may be provided with a second, lower temperature coolant. The heat exchanger 32 can cool the first coolant in the second cavity 22 by using the second coolant. The coolant driving device 33 is configured to circulate the first coolant between the second cavity 22 and the first cavity 21. The guiding assembly 34 includes a liquid flow channel (not shown) for guiding the first coolant from the coolant driving device 33 to the heat exchanger 32. With this arrangement, the low-temperature first coolant can enter the first cavity 21 from the second cavity 22 through the first group of through holes 61 shown in FIG. 3 to absorb heat from the electronic device, the first coolant after heat absorption and heating can enter the second cavity 22 from the first cavity 21 via the second group of through holes 62, and is driven into the liquid flow channel of the guiding component 34 by the coolant driving device 33, and then reaches the heat exchanger 32 along the liquid flow channel to be cooled again to perform the next circulate.

As shown in FIG. 5, the coolant driving device 33 is arranged above the heat exchanger 32, wherein the coolant driving device 33 is close to the top side of the heat exchange module 3, and the heat exchanger 32 is close to the bottom side of the heat exchange module 3. With reference to FIGS. 1 and 2, when the heat exchange module 3 is inserted into the second cavity 22, the coolant driving device 33 will be closer to the opening 221 of the second cavity 22 than the heat exchanger 32. In some embodiments, the coolant driving device 33 may be adjacent to the second group of through holes 62 shown in FIG. 3, and the heat exchanger 32 may be adjacent to the first group of through holes 61 shown in FIG. 3.

In an embodiment according to the present disclosure, the coolant driving device 33 is detachably mounted in the heat exchange module 3. Thus, the coolant driving device 33 can be extracted from the second cavity 22 with the heat exchanger 32 and the guiding assembly 34 held in the second cavity 22. Since the operation and maintenance requirements of the coolant driving device 33 in the heat exchange module 3 are higher compared with the heat exchanger 32, the coolant driving device 33 can be separately extracted from the cabinet 2 by disposing the coolant driving device 33 above the heat exchanger 32, which facilitates the maintenance of the coolant driving device 33 and shortens the maintenance time of the coolant driving device 33.

In some embodiments, as shown in FIGS. 4 and 5, the heat exchange module 3 further includes a first bracket 30, and the first bracket 30 includes a first support part 301 and a second support part 302. The first support part 301 and the second support part 302 may be assembled or connected together by welding, bolts, or other manners, so as to support other components of the heat exchange module 3. When the heat exchange module 3 is inserted into the second cavity 22, the first support part 301 is located outside the second cavity 22 and is supported by the outer frame 23. In this way, the overall weight of the heat exchange module 3 may be reliably supported on the outer frame 23 by the first support part 301. The second support part 302 is configured to support some other components of the heat exchange module 3. For example, the heat exchanger 32 and the guiding assembly 34 may be disposed on the second support part 302.

In an example implementation, as shown in FIGS. 4 and 5, the heat exchanger 32 and the guiding assembly 34 are fixed to the second bracket 302 by fasteners 37. The fastener 37 may be, for example, a U-shaped bead that may fix the heat exchanger 32 and the guiding assembly 34 to the second bracket 302 with bolts. It should be understood that the fastener 37 are merely exemplary and are not intended to limit the scope of the present disclosure in any way. In other example implementations, the heat exchanger 32 and the guiding assembly 34 may be fixed to the second bracket 302 by other means.

In some embodiments, a sealing ring (not shown) is disposed on a side (i.e., the bottom side) of the first support part 301 facing the second cavity 22. When the heat exchange module 3 is inserted into the second cavity 22, the first support part 301 and the second cavity 22 are sealed by the sealing ring. The sealing ring may include, for example, EPDM rubber or other types of sealing materials. By adopting the sealing ring, the sealing performance between the first support part 301 and the second cavity 22 can be improved, and the leakage of the first coolant in the second cavity 22 is reduced.

In some embodiments, as shown in FIGS. 4 and 5, a side (i.e., a top side) of the first support part 301 facing away from the second cavity 22 is provided with a display screen 35 for displaying an operating state of the coolant driving device 33. The operation state of the coolant driving device 33 can be observed in real time through the display screen 35, so that the coolant driving device 33 may be maintained when the coolant driving device 33 operates abnormally.

In some embodiments, as shown in FIGS. 4 and 5, the heat exchange module 3 further includes a logic control assembly 36 for monitoring and/or controlling an operating state of the coolant driving device 33. The logic control assembly 36 may be supported by the first support part 301 and disposed on a side of the first support part 301 facing the second cavity 22. The logic control assembly 36 may also be disposed at other locations, which is not limited in the embodiments of the present disclosure.

In some embodiments, the heat exchange module 3 further includes one or more sensors (not shown) for detecting the state of the first coolant in the second cavity 22. For example, a conductivity sensor may be used to detect the conductivity of the first coolant, and a temperature sensor may be used to detect the temperature of the first coolant. The signal detected by the sensor may be transmitted to the logic control assembly 36 to control the operating state of the coolant driving device 33.

In some embodiments, as shown in FIGS. 4 and 5, the heat exchange module 3 further includes one or more liquid-occupying blocks 38. With the heat exchange module 3 inserted into the second cavity 22, the liquid-occupying blocks 38 can be at least partially immersed in the first coolant in the second cavity 22. In this way, the liquid-occupying blocks 38 can discharge the volume of the first coolant in the second cavity 22, so that the liquid level of the first coolant in the second cavity 22 rises, the amount of the first coolant required in the cabinet 2 is reduced, and the overall cost is reduced.

Figure 6:
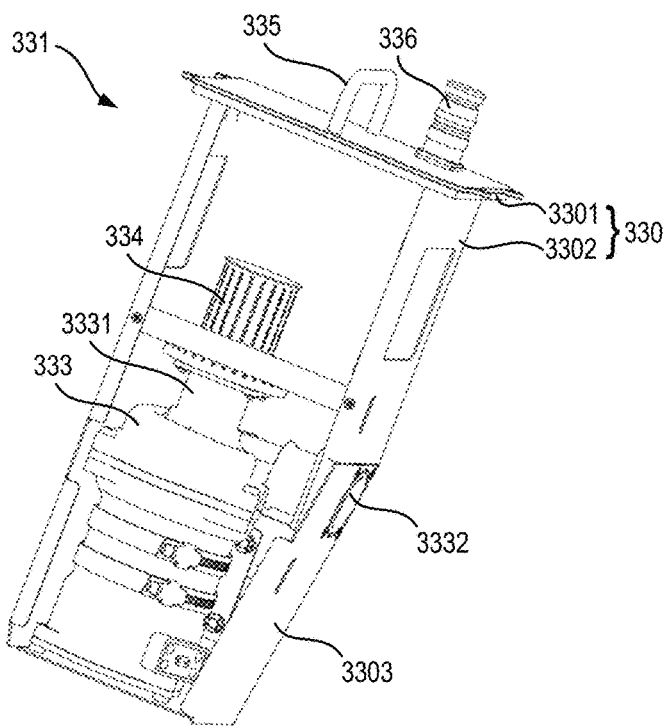
FIG. 6 is a schematic structural diagram of a first driving assembly according to an embodiment of the present disclosure.
Figure 7:
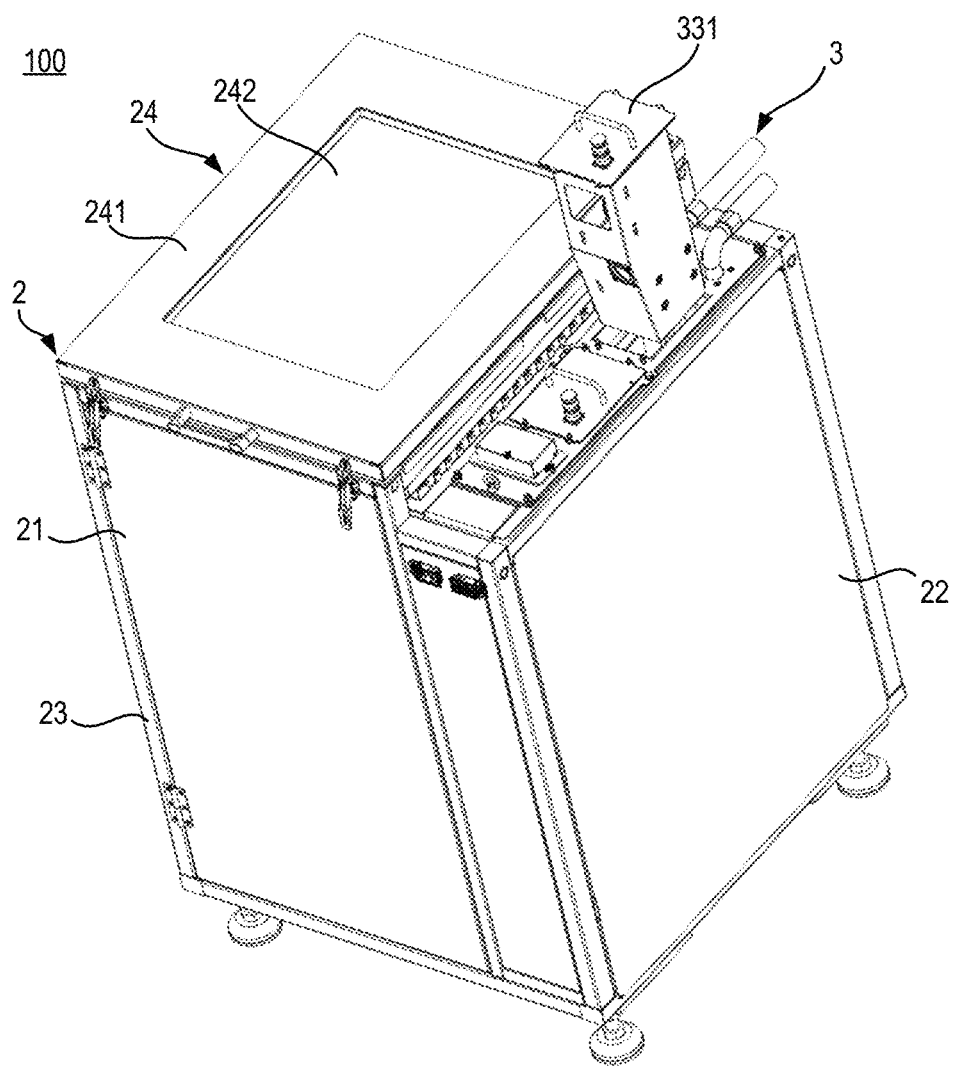
FIG. 7 shows a state where the first driving assembly in the immersion liquid cooling device shown in FIG. 1 is extracted.

In some embodiments, as shown in FIGS. 4 and 5, the coolant driving device 33 includes a first driving assembly 331. FIG. 6 illustrates an example structure of the first driving assembly 331. As shown in FIG. 6, the first driving assembly 331 includes a second bracket 330 and a first circulating pump 333 supported by the second bracket 330. With reference to FIGS. 4-6, the second bracket 330 is detachably connected to the first bracket 30. In an example implementation, the second bracket 330 may be bolted to the first bracket 30. In another example implementation, the second bracket 330 may be snap-fitted to the first bracket 30 by a snap. In other implementations, the second bracket 330 may be detachably connected to the first bracket 30 in other manners, which is not intended to be limited in the embodiments of the present disclosure. With such an arrangement, in the case where the heat exchange module 3 is inserted into the second cavity 22, the first driving assembly 331 can be separately extracted from the second cavity 22 for maintenance, as shown in FIG. 7.

With reference to FIGS. 4-6, the first circulating pump 333 includes a circulating pump inlet 3331 and a circulating pump outlet 3332. With the second bracket 330 connected to the first bracket 30, the circulating pump outlet 3332 of the first circulating pump 333 will be in communication with the liquid flow path in the guiding assembly 34. Thus, the first circulating pump 333 can drive the first coolant into the liquid flow channel of the guiding assembly 34.

In some embodiments, as shown in FIG. 6, the first driving assembly 331 further includes a filter 334 disposed at the circulating pump inlet 3331 of the first circulating pump 333. The filter 334 may filter the first coolant entering the first circulating pump 333 to prevent impurities from entering the pump body to cause damage to the first circulating pump 333.

In some embodiments, as shown in FIG. 6, the second bracket 330 includes a third support part 3301 and a fourth support part 3302. With reference to FIGS. 4-6, the third support part 3301 is detachably connected to the first support part 301, and the first circulating pump 333 is supported by the fourth support part 3302. The third support part 3301 may be connected to the first support part 301 by bolts, snaps or other structures.

In some embodiments, as shown in FIG. 6, a handle 335 is disposed on a side (top side) of the third support part 3301 facing away from the first circulating pump 333. When the third support part 3301 is not connected to the first connecting portion 301, the first driving assembly 331 can be conveniently extracted from the second cavity 22 through the handle 335, as shown in FIG. 7. When the third support part 3301 is connected to the first connecting portion 301, the heat exchange module 3 can be conveniently extracted from the second cavity 22 through the handle 335, as shown in FIG. 2.

As shown in FIG. 6, one or more electrical connectors 336 may also be provided on a side of the third support part 3301 facing away from the first circulating pump 333, and power and control of the first circulating pump 333 may be achieved through the electrical connector 336.

In some embodiments, with reference to FIGS. 4-6, the fourth support part 3302 includes a first inclined portion 3303 inclined relative to the extraction direction X (e.g., the vertical direction in FIG. 5) of the first driving assembly 331, and the circulating pump outlet 3332 of the first circulating pump 333 is disposed at the first inclined portion 3303. Accordingly, the guiding assembly 34 includes a second inclined portion 3411 that is inclined relative to the extraction direction X. When the third support part 3301 is connected to the first support part 301, the second inclined portion 3411 is attached to the first inclined portion 3303, thereby realizing communication between the circulating pump outlet 3332 of the first circulating pump 333 and the liquid flow channel in the guiding assembly 34. By providing the first inclined portion 3303 and the second inclined portion 3411, on one hand, accurate positioning of the first driving assembly 331 during insertion can be ensured, and on the other hand, reliable communication between the circulating pump outlet 3332 of the first circulating pump 333 and the liquid flow channel in the guiding assembly 34 can be ensured.

In some embodiments, a seal ring may be provided at the circulating pump outlet 3332 of the first circulating pump 333 and the inlet of the liquid flow channel in the guiding assembly 34 to improve the sealing performance therebetween, thereby ensuring that the first circulating pump 333 can reliably drive the first coolant into the heat exchanger 32.

In some embodiments, as shown in FIGS. 4 and 5, the coolant driving device 33 further includes a second driving assembly 332. The second driving assembly 332 is disposed side by side with the first driving assembly 331 and has a structure similar to that of the first driving assembly 331. For example, the second driving assembly 332 may include a third bracket and a second circulating pump supported by the third bracket. The structure of the third bracket is similar to that of the second bracket 330, and the structure of the second circulating pump is similar to that of the first circulating pump 333, and details are not described herein again. The third bracket is detachably connected to the first bracket 30. Thus, similar to the first driving assembly 331, the second driving assembly 332 may likewise be extracted from the second cavity 22 alone or along with the heat exchanger 32. By providing the redundant second driving assembly 332, when one of the first driving assembly 331 and the second driving assembly 332 has a problem, the other driving assembly can still operate normally, thereby improving the reliability of the liquid cooling device 100. It should be understood that, in other embodiments, the coolant driving device 33 may further include more driving assemblies to further reminder the redundant performance of the liquid cooling device 100.

In some embodiments, as shown in FIGS. 4 and 5, the guiding assembly 34 includes a first guide 341 and a second guide 342 and a third guide 343 disposed above the first guide 341. The liquid flow channel in the second guide 342 is in communication with the circulating pump outlet 3332 of the first circulating pump 333. The liquid flow channel in the third guide 343 is in communication with the circulating pump outlet of the second circulating pump. The liquid flow path in the first guide 341 is connected to the heat exchanger 32. The liquid flow channels in the second guide 342 and the third guide 343 are respectively in communication with the liquid flow channel in the first guide 341. By providing the first guide member 341, the second guide member 342 and the third guide member 343, on one hand, the first coolant can be reliably guided from the coolant driving device 33 to the heat exchanger 32, and on the other hand, the volume of the first coolant in the second cavity 22 can be discharged, so that the liquid level of the first coolant in the second cavity 22 rises, the amount of the first coolant required in the cabinet 2 is reduced, and the overall cost is reduced.

As shown in FIGS. 4 and 5, the second inclined portion 3411 described above may be provided on the second guide member 342 and the third guide member 343 so as to respectively correspond to the first inclined portions 3303 on the first driving assembly 331 and the second driving assembly 332.

In other embodiments, the guiding assembly 34 may have other configurations to guide the first coolant from the coolant driving device 33 to the heat exchanger 32, the scope of which is not limited in this respect.

Figure 8:
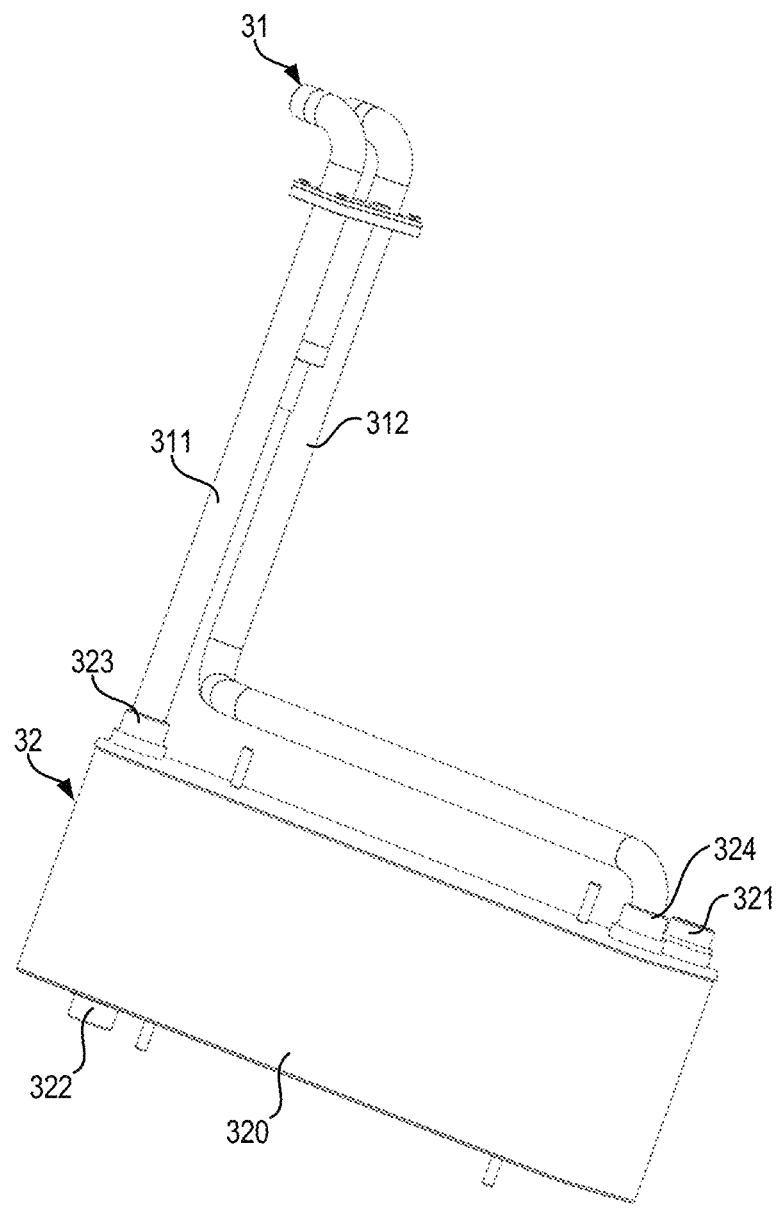
FIG. 8 shows a schematic structural diagram of a heat exchanger according to an embodiment of the present disclosure.

As described above, the heat exchanger 32 may use the second coolant to cool the first coolant. An example structure of the heat exchanger 32 will be described below in conjunction with FIG. 8. As shown in FIG. 8, the heat exchanger 32 is a plate heat exchanger including an outer cavity 320 and an inner cavity (not shown) surrounded by the outer cavity 320. The outer cavity 320 includes a first liquid inlet 321 and a first liquid outlet 322, the first liquid inlet 321 is configured to be connected to the liquid flow channel in the guiding assembly 34 to receive the first coolant, and the first liquid outlet 322 is configured to release the first coolant from the outer cavity 320 into the second cavity 22. The inner cavity includes a second liquid inlet 323 and a second liquid outlet 324, the second liquid inlet 323 is connected to the liquid inlet pipe 311 in the liquid circulating pipeline 31 to receive the second coolant from the cooling tower, and the second liquid outlet 324 is connected to the liquid return pipe 312 in the liquid circulating pipeline 31 to return the second coolant to the cooling tower. The first coolant in the outer cavity 320 and the second coolant in the inner cavity may form heat exchange in the form of cross-flow, which enhances the heat exchange efficiency of the heat exchanger 32.

In other embodiments, the heat exchanger 32 may be of other types of heat exchanger, and the scope of the present disclosure is not limited in this regard.

In some embodiments, the immersion liquid cooling device 100 further includes a height-setting bracket (not shown) disposed below the first cavity 21 and supporting the first cavity 21. With this arrangement, the user can match the liquid cooling device with different height-setting brackets according to the actual depth of the electronic device, thereby saving the usage amount of the first coolant and reducing the overall cost of the liquid cooling device. In some cases, the height-setting bracket may also support the second cavity 22.

Figure 9:
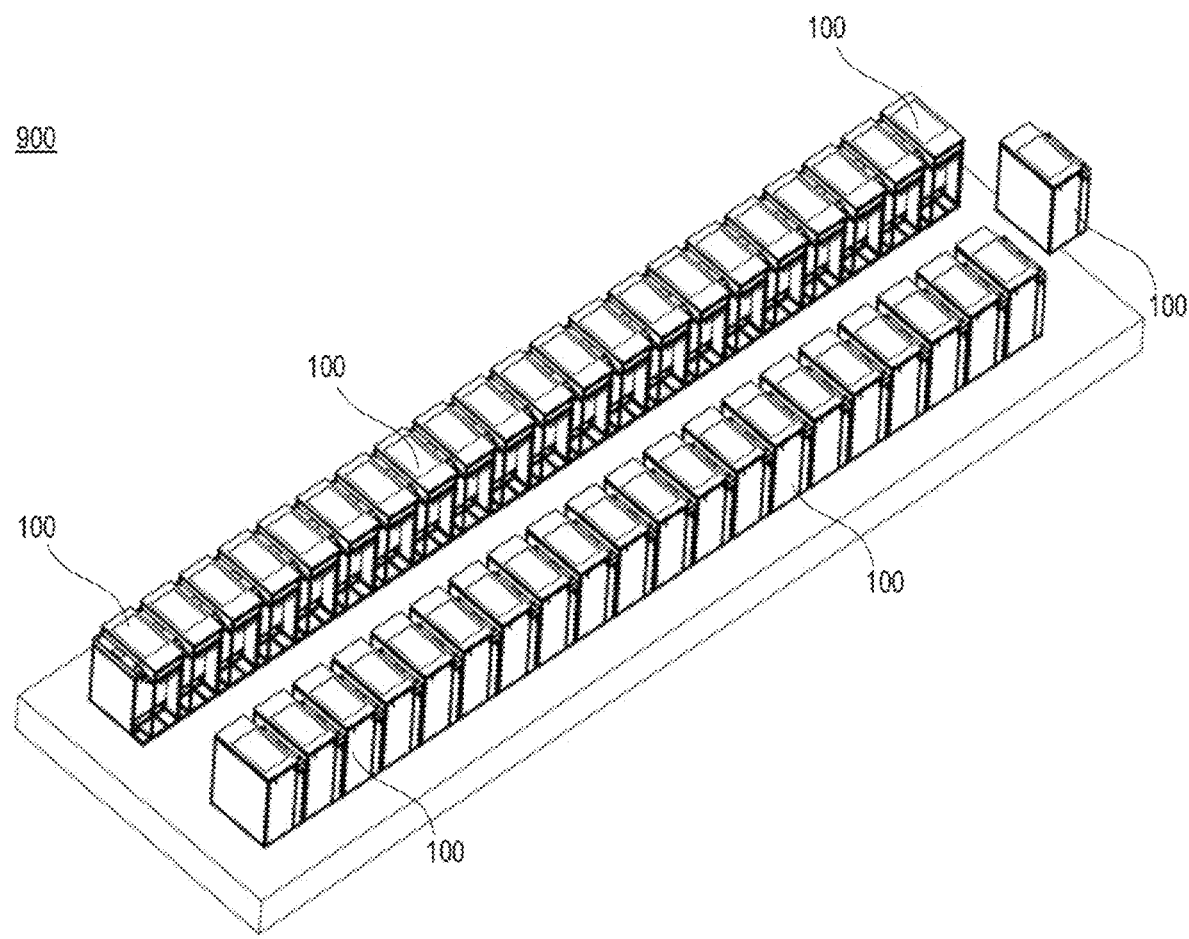
FIG. 9 shows a schematic structural diagram of a liquid cooling system according to an embodiment of the present disclosure.

FIG. 9 shows a schematic structural diagram of a liquid cooling system 900 according to an embodiment of the present disclosure. As shown in FIG. 9, the liquid cooling system 900 includes a plurality of immersion liquid cooling devices 100 arranged side by side. Each of the plurality of immersion liquid cooling devices 100 may be any of the immersion liquid cooling devices 100 described in connection with FIG. 1 to FIG. 8.

Whether in a small, medium or large data center deployment, the user can set the number of the immersion liquid cooling devices 100 according to the service requirements, thereby forming a service system with different scales, which brings a more flexible and efficient immersion liquid cooling system deployment mode for the data center. The problem that a single fault loss caused by multiple pieces of IT equipment in a single cabinet is solved. For example, in some edge computing use scenarios, the miniature immersion liquid cooling device 100 can be deployed independently in a small amount, which brings more miniaturized flexible deployment application scenarios.

In addition, during large-scale cluster deployment, the immersion liquid cooling device 100 can be arranged in the data center machine room in advance by presetting the cabinet 2 and the heat exchange module 3 in advance, and the liquid circulating pipeline 31 and the primary side coolant supply system (for example, the cooling tower) are connected and debugged. Subsequently, the user can re-purchase the IT equipment when there is a service demand, deployment the IT equipment into the first cavity 21 of the cabinet 2, and finally add the first coolant into the first cavity 21, thereby completing deployment of the whole system. In this way, the deployment time of the data center can be greatly shortened.

An embodiment of the present disclosure further provides a data center deployment in a large-scale cluster, including: a plurality of immersion liquid cooling devices 100, which are pre-arranged in a data center machine room, and each immersion liquid cooling device 100 has not provided an electronic device and has not yet injected the first coolant; and a primary side coolant supply system (for example, a cooling tower), which is connected to the liquid circulating pipeline 31 in the heat exchange module 3 of each immersion liquid cooling device 100 through an infusion tube. With this arrangement, the immersion liquid cooling device 100 and the primary side coolant can be connected and debugged in advance, which facilitates rapid large-scale cluster deployment.

In embodiments according to the present disclosure, the first cavity 21 of the cabinet 2 in the immersion liquid cooling device 100 may be designed to have different dimensions, such as different depths, for accommodating different sizes of IT equipment, such as 4U, 8U, 12U, etc., where U represents the height unit of the IT equipment, 1U=1.75 inches=4.445 centimeters, 4U=7 inches=17.78 centimeters, 8U=14 inches=35.56 centimeters, 12U=21 inches=53.34 centimeters. Accordingly, the height-setting brackets may be of different size such that the same group of outer frames 23 may accommodate different first cavities 21. In some embodiments, the height-setting bracket may also be a height-setting bracket having an adjustable height.

For example, the depth of the general calculation type server is 600 mm, the depth of the storage type server is 800 mm, and the cabinet 2 can adjust the depth of the first cavity 21 through the height-setting bracket at the bottom; by designing the first cavity 21 with different depths, the usage amount of the first coolant can be significantly reduced.

Embodiments of the present disclosure provide a liquid cooling system design of an internal integrated heat exchanger, which efficiently implements self-circulating cooling of IT equipment such as servers, switches and the like arranged in the internal integrated heat exchanger, reduces data center investment and overall operation cost, enables the overall power supply efficiency (PUE) of the data center to be controlled below 1.1, and can save energy. In addition, by arranging the coolant driving device above the heat exchanger, the coolant driving device can be separately extracted from the cabinet, which facilitates maintenance of the coolant driving device and shortens the maintenance time of the coolant driving device.

Various embodiments of the present disclosure have been described above, which are exemplary, not exhaustive, and are not limited to the embodiments disclosed. Many modifications and variations will be apparent to those of ordinary skill in the art without departing from the scope and spirit of the illustrated embodiments. The selection of the terms used herein is intended to best explain the principles of the embodiments, practical applications, or technical improvements in the marketplace, or to enable others of ordinary skill in the art to understand the embodiments disclosed herein.

We claim:

1. An immersion liquid cooling device comprising:
a cabinet comprising a first cavity and a second cavity integrated on a side wall of the first cavity, the first cavity being configured to accommodate an electronic device to be cooled, and the side wall being provided with a through hole for a first coolant to circulate between the first cavity and the second cavity; and
a heat exchange module adapted to be inserted into the second cavity via an opening on the second cavity, the heat exchange module comprising a heat exchanger, a coolant driving device and a guiding assembly, the heat exchanger being configured to receive a second coolant via a liquid circulating pipeline and cool the first coolant with the second coolant, the coolant driving device being configured to drive the first coolant to circulate between the second cavity and the first cavity, and the guiding assembly comprising a liquid flow channel configured to guide the first coolant from the coolant driving device to the heat exchanger, wherein when the heat exchange module is inserted into the second cavity, the coolant driving device is closer to the opening of the second cavity than the heat exchanger, and the coolant driving device is capable of being extracted from the second cavity when the heat exchanger and the guiding assembly are kept in the second cavity.

2. The immersion liquid cooling device of claim 1, wherein the heat exchange module further comprises a first bracket, and the heat exchanger and the guiding assembly are supported by the first bracket, and
the coolant driving device comprises a first driving assembly, the first driving assembly comprises a second bracket and a first circulating pump supported by the second bracket, the second bracket is detachably connected to the first bracket, wherein when the second bracket is connected to the first bracket, a circulating pump outlet of the first circulating pump is communicated with a liquid flow channel in the guiding assembly.

3. The immersion liquid cooling device of claim 2, wherein the first bracket comprises a first support part and a second support part, the second bracket is detachably connected to the first support part, the heat exchanger and the guiding assembly are supported by the second support part, and when the heat exchange module is inserted into the second cavity, the first support part is located outside the second cavity.

4. The immersion liquid cooling device of claim 3, wherein a side of the first support part facing the second cavity is provided with a sealing ring, and when the heat exchange module is inserted into the second cavity, the first support part and the second cavity are sealed through the sealing ring.

5. The immersion liquid cooling device of claim 3, wherein a side of the first support part facing away from the second cavity is provided with a display screen for displaying an operating state of the coolant driving device.

6. The immersion liquid cooling device of claim 3, wherein the heat exchanger and the guiding assembly are fixed to the second support part through fasteners.

7. The immersion liquid cooling device of claim 3, wherein the second bracket comprises a third support part and a fourth support part, the third support part is detachably connected to the first support part, and the first circulating pump is supported by the fourth support part.

8. The immersion liquid cooling device of claim 7, wherein a side of the third support part facing away from the first circulating pump is provided with a handle.

9. The immersion liquid cooling device of claim 7, wherein the fourth support part comprises a first inclined portion inclined relative to an extraction direction of the first driving assembly, and the circulating pump outlet of the first circulating pump is disposed at the first inclined portion, and
the guiding assembly comprises a second inclined portion inclined relative to the extraction direction, wherein the second inclined portion is attached to the first inclined portion when the third support part is connected to the first support part.

10. The immersion liquid cooling device of claim 2, wherein the first driving assembly further comprises a filter provided at a circulating pump inlet of the first circulating pump.

11. The immersion liquid cooling device of claim 2, wherein the coolant driving device further comprises a second driving assembly, the second driving assembly comprises a third bracket and a second circulating pump supported by the third bracket, and the third bracket is detachably connected to the first bracket.

12. The immersion liquid cooling device of claim 11, wherein the guiding assembly comprises a first guide, a second guide and a third guide, the second guide and the third guide are disposed above the first guide, a liquid flow channel in the second guide is communicated with the circulating pump outlet of the first circulating pump, a liquid flow channel in the third guide is communicated with a circulating pump outlet of the second circulating pump, and a liquid flow channel in the first guide is connected to the heat exchanger.

13. The immersion liquid cooling device of claim 1, wherein the heat exchanger is a plate heat exchanger comprising an outer cavity and an inner cavity surrounded by the outer cavity,
the outer cavity comprises a first liquid inlet and a first liquid outlet, the first liquid inlet is connected to a liquid flow channel in the guiding assembly to receive the first coolant, the first liquid outlet is configured to release the first coolant from the outer cavity into the second cavity, and
the inner cavity comprises a second liquid inlet and a second liquid outlet, the second liquid inlet is connected to a liquid inlet pipe in the liquid circulating pipeline to receive the second coolant, and the second liquid outlet is connected to a liquid return pipe in the liquid circulating pipeline.

14. The immersion liquid cooling device of claim 1, wherein the through hole comprises a first group of through holes and a second group of through holes, the second group of through holes are closer to the opening of the second cavity than the first group of through holes, and when the heat exchange module is inserted into the second cavity, the coolant driving device is adjacent to the second group of through holes, and the heat exchanger is adjacent to the first group of through holes.

15. The immersion liquid cooling device of claim 1, wherein the heat exchange module further comprises a liquid-occupying block, wherein when the heat exchange module is inserted into the second cavity, the liquid-occupying block is capable of being at least partially immersed in the first coolant in the second cavity.

16. The immersion liquid cooling device of claim 1, wherein the cabinet further comprises an outer frame and a top cover, the outer frame is disposed around the first cavity and the second cavity, the top cover is rotatably connected to the outer frame and capable of switching between a closed state in which the first cavity is closed and an open state in which the first cavity is opened.

17. The immersion liquid cooling device of claim 16, wherein a side of the top cover facing the first cavity is provided with a sealing ring, and when the top cover is in the closed state, the top cover and the first cavity are sealed through the sealing ring.

18. The immersion liquid cooling device of claim 16, wherein the cabinet further comprises a hydraulic driving device connected between the outer frame and the top cover to drive the top cover to switch between the closed state and the open state.

19. The immersion liquid cooling device of claim 1, wherein the first coolant comprises a fluorinated liquid or a mineral oil, and/or the second coolant comprises deionized water.

20. A liquid cooling system comprising a plurality of immersion liquid cooling devices arranged side by side, wherein each immersion liquid cooling device of the plurality of immersion liquid cooling devices is an immersion liquid cooling device comprising:

a cabinet comprising a first cavity and a second cavity integrated on a side wall of the first cavity, the first cavity being configured to accommodate an electronic device to be cooled, and the side wall being provided with a through hole for a first coolant to circulate between the first cavity and the second cavity; and a heat exchange module adapted to be inserted into the second cavity via an opening on the second cavity, the heat exchange module comprising a heat exchanger, a coolant driving device and a guiding assembly, the heat exchanger being configured to receive a second coolant via a liquid circulating pipeline and cool the first coolant with the second coolant, the coolant driving device being configured to drive the first coolant to circulate between the second cavity and the first cavity, and the guiding assembly comprising a liquid flow channel configured to guide the first coolant from the coolant driving device to the heat exchanger, wherein when the heat exchange module is inserted into the second cavity, the coolant driving device is closer to the opening of the second cavity than the heat exchanger, and the coolant driving device is capable of being extracted from the second cavity when the heat exchanger and the guiding assembly are kept in the second cavity.

* * * * *